US005831830A

United States Patent [19]

Mähler

[11] Patent Number: 5,831,830

[45] Date of Patent: Nov. 3, 1998

[54] DEVICE FOR COOLING OF ELECTRONICS UNITS

[75] Inventor: Hans Mähler, Onsala, Sweden

[73] Assignee: Telefonaktiebolaget LM Ericsson, Stockholm, Sweden

[21] Appl. No.: 715,842

[22] Filed: Sep. 26, 1996

[30] Foreign Application Priority Data

Sep. 29, 1995 [SE] Sweden .................................. 9503393

[51] Int. Cl.[6] ........................................................ H05K 7/20

[52] U.S. Cl. .......................... 361/704; 361/690; 361/703; 361/709; 361/717; 361/718; 361/719; 174/16.1; 174/16.3; 165/80.3; 165/185

[58] Field of Search ..................................... 361/689, 690, 361/703, 717, 718, 719; 174/16.1, 16.3; 165/80.3, 185

[56] References Cited

U.S. PATENT DOCUMENTS

| | | | |
|---|---|---|---|
| 3,871,001 | 3/1975 | Myers . | |
| 3,961,666 | 6/1976 | Suzuki et al. | 165/80.3 |
| 4,535,386 | 8/1985 | Frey, Jr. et al. | 361/714 |
| 4,858,069 | 8/1989 | Hughes | 165/80.3 |
| 4,987,425 | 1/1991 | Zahn et al. | 343/853 |
| 5,091,827 | 2/1992 | Suret et al. | 361/818 |
| 5,276,584 | 1/1994 | Collins et al. | 361/718 |

FOREIGN PATENT DOCUMENTS

| | | |
|---|---|---|
| 325 701 | 8/1989 | European Pat. Off. . |
| 614 245 | 9/1994 | European Pat. Off. . |

OTHER PUBLICATIONS

Patent Abstracts of Japan, vol. 16, No. 312, E–1230, abstract of JP–A–4–87402 (Appl. No. 2–203030) 19 Mar. 1992.

Patent Abstracts of Japan, vol. 17, No. 128, E–1333, abstract of JP–A–4–304005 (Appl. No. 3–68113) 27 Oct. 1992.

*Primary Examiner*—Gerald P. Tolin
*Assistant Examiner*—Boris L. Chervinsky
*Attorney, Agent, or Firm*—Burns, Doane, Swecker & Mathis, L.L.P.

[57] ABSTRACT

Device for cooling of electronics units (1) carried by a support structure (2) with flat sections (3, 4, 5) and comprising several flat antenna elements (6). The support structure (2) and the flat antenna element (6) extend generally in the vertical direction and present an intermediate cavity (16) having an air inlet opening arranged at a lower region and an outlet opening arranged at an upper region. In this manner, air is forced to flow through said cavity by means of self-circulation.

4 Claims, 2 Drawing Sheets

DEVICE FOR COOLING OF ELECTRONICS UNITS

TECHNICAL FIELD

The present invention relates to a device for cooling of electronics units in accordance with the preamble of appended claim 1.

BACKGROUND OF THE INVENTION

Cooling of electronic equipment is traditionally carried out by means of fans which generate a circulation of air around the electronics and which consequently carries away heated air. Japanese patent application no. JP 2-203030 shows an electronics unit having an antenna panel which is supported by a metal profile. This profile presents a cavity, in one end of which a fan is arranged. Fans require an electric power supply and have a useful lifetime which is limited. This is a drawback, particularly in systems which are arranged in inaccessible positions outdoors and which should require minimal maintenance.

SUMMARY OF THE INVENTION

The object of the present invention is to avoid said disadvantage and to provide a cooling device which is maintenance-free and which thus provides a long useful lifetime.

Said object is accomplished by means of a device according to the present invention, the features of which will become apparent from the subsequent claim 1.

By means of the device according to the invention, heated air is carried away due to self-circulation and thus without any need for electrically operated fans.

BRIEF DESCRIPTION OF THE DRAWINGS

The invention will be described in greater detail in the following with reference to an embodiment and the annexed drawings, in which.

PREFERRED EMBODIMENT

Figure 1:
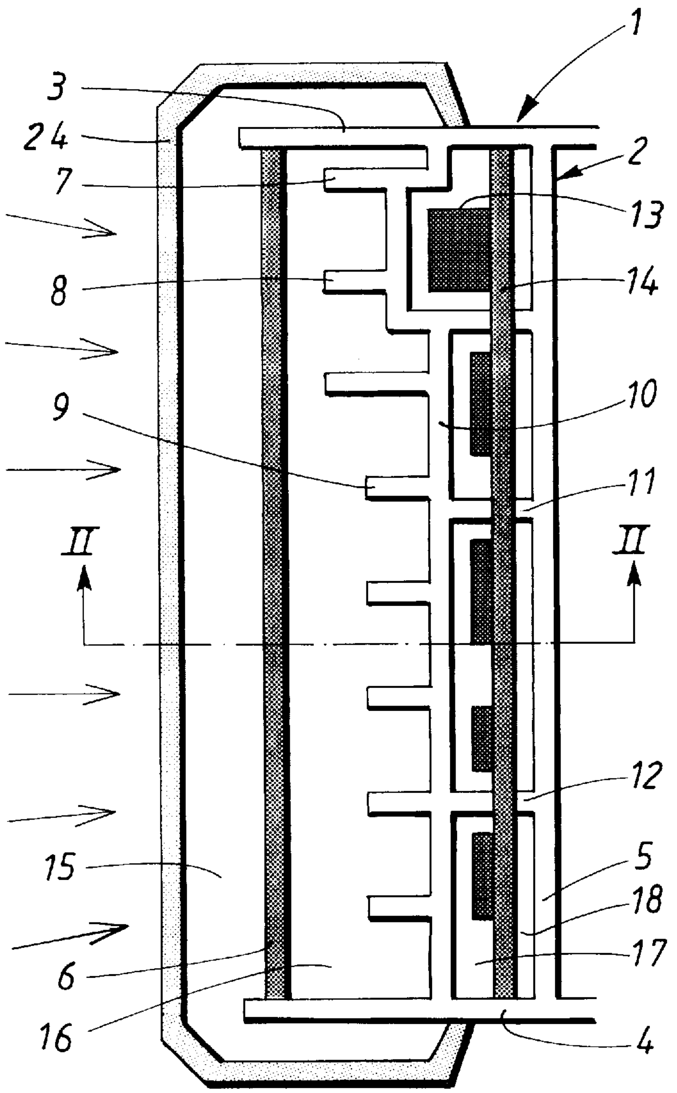
FIG. 1 shows a plan view of an electronics unit provided with a cooling device according to the present invention.

The cooling device according to the present invention is integrated with the electronics unit 1 which is intended to be cooled and presents a heat-conductive, shielding and supporting structure 2, which for example can be arranged as a metal profile made for example from aluminium. The metal profile consists of flat wall sections, in the shown example comprising two side sections 3, 4 and a rear section 5. One or several flat sector antennas 6 are arranged between the side sections 3, 4 and in front of the rear section 5, which antennas thus are arranged as plate-shaped elements arranged on laminated material. In this regard, the antenna section is constructed from conductive material arranged in accordance with predetermined patterns, so as to provide the desired antenna configuration. This technology demands a ground plane behind the radiating element (or elements) at a distance which is wavelength-dependent. Depending on the desired impedances, there is a demand for varying the ground plane distance between different parts of the antenna. To this end, the support structure 2 is arranged with a plurality of flanges 7, 8, 9 which are distributed between the cooling flanges at distances which are significantly smaller than one wavelength. The demand for different ground plane distances to the antenna unit 6 can be satisfied by varying the height of the cooling flanges. The flanges 7, 8, 9 are supported between the side sections 3, 4 and the rear section 5 by means of different wall sections 10, 11, 12 in the support structure. Furthermore, the latter structure supports electronic circuits having electronic components 13 on a printed circuit board 14, which in the shown example extends between the side sections 3, 4 and essentially parallel to the rear section 5. The electronic components 13 are enclosed in a heat-conductive material, for example aluminium, which constitutes a part of the support structure 6 or, alternatively, which conducts away heat generated in the components 13 to said structure and discharges heat to the cavity of air via its surfaces and the cooling flanges 7, 8, 9. The electronics unit 1 is at least partly enclosed by means of a radome 24 which consequently forms a casing which essentially encloses the part of the electronics unit which presents the antenna unit 6 with the radiating antenna elements. In a manner which is previously known per se, the radome 24 is made from a material, for example a suitable polymer, which is permeable to radio waves of the presently employed frequency range with as low losses or attenuation as possible. For example, the electronics unit can be constituted by a base station or a so-called cellular station having a transmitter and a receiver for transmission of wireless telecommunication to and from mobile radio units having a transmitter and a receiver for telephone communication, telefax, computer communication etc.

In accordance with the present invention, the above-mentioned units are arranged so that the flat elements extend essentially in the vertical direction and present an internal interspace so as to form elongated cavities 15, 16 between the different flat sections. Furthermore, the cavities also open towards the surrounding environment via a lower opening 19 forming an inlet opening and an upper opening 20 forming an outlet opening for air which may thus flow through the electronics unit.

Figure 2:
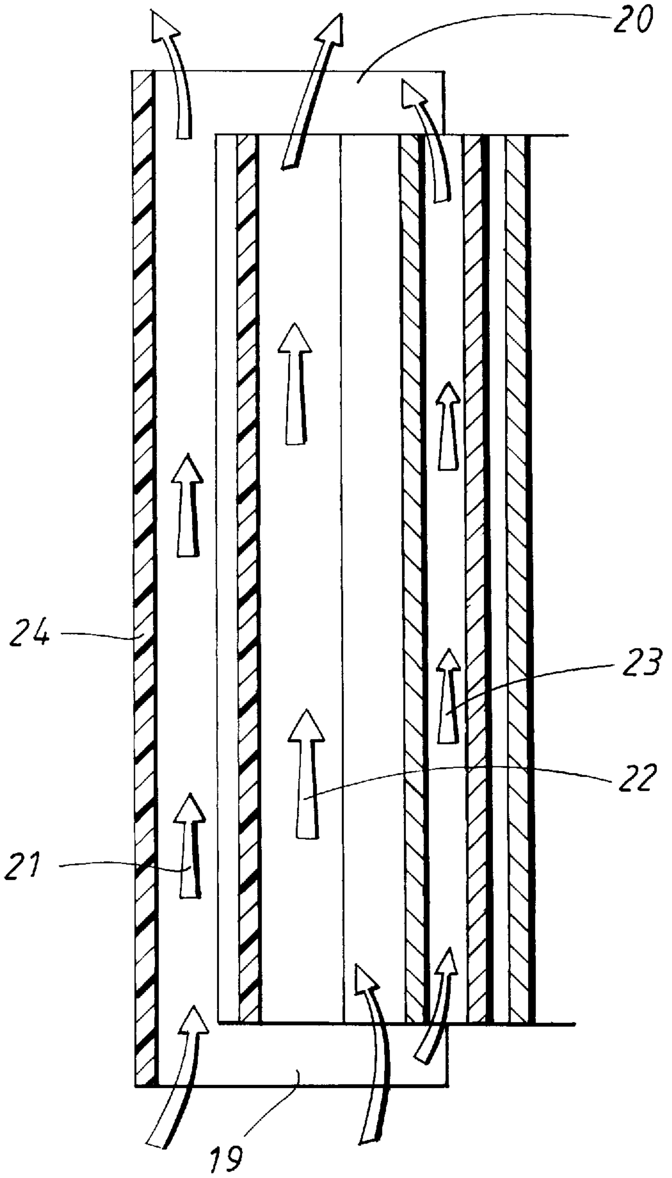
FIG. 2 shows a vertical cross-section through the device according to FIG. 1, along the line II—II.

If electronics units are arranged outdoors, unwanted heat is generated, not only due to the energy generation in the electronic components but also due to solar radiation which incides towards the radome 24 and which indirectly heats the antenna unit 6, the conductive surface of which has a tendency to absorb heat energy to a great extent. By means of the device according to the invention, which presents a plurality of air gaps or cavities, heated air is carried away and replaced with air at a lower temperature. For example, solar heat is evacuated by means of a transport of air in the direction according to the arrows 21 of FIG. 2, due to the fact that air enters through the lower inlet opening 19 and exits through the upper outlet opening 20. In a corresponding manner, heat is evacuated from the electronic components and circuits due to conduction of heat to the support structure 2 and the corresponding cooling flanges 8, which surfaces transmit heat due to radiation to the surrounding cavity 16. In this manner, a self-circulation is generated through the cavity of the electronics unit due to the fact that the heated air is urged to rise and consequently to flow through the cavities in the direction of the arrows 22, 23. New air having a lower temperature is also forced to flow in through the inlet opening 19 and to flow out through the outlet opening 20, at the same time cooling the surfaces in the electronics unit which are swept by the air.

Due to the above-mentioned design, effective cooling of electronics units is obtained without the need or a separate power supply and with a cooling device which is completely maintenance-free and which requires little space. This is due to the fact that it presents components which are combined with other primary functions. Consequently, the device becomes extremely cost-effective.

The invention is not limited to the embodiments described above and shown in the drawings, but may be varied within the scope of the appended claims. For example, the number of air gaps and cavities may vary, in principle from one single cavity to a large number of cavities. In the case of one single cavity, the basic design consists of a plane antenna element and electronic components arranged with gaps to the antenna element so that a cavity is formed, the cavity being open at the lower and upper parts thereof so as to allow for air to flow therethrough. The cavities may be open towards their upper and lower parts by means of a common inlet opening 19 and outlet opening 20 or by means of separate inlet openings and outlet openings for each cavity. Alternatively, the radome 24 may embrace the electronics unit so as to form said openings 19, 20 at the upper and lower parts thereof. In the present case, the term "electronics unit" 1 is intended to describe the complete unit with the support structure 2, the antennas 6, the electronic components 13 and the printed circuit board 14.

I claim:

1. Device for cooling of electronics units supported by a support structure having flat sections and comprising one or several flat elongated antenna elements wherein the support structure as well as said flat elongated antenna element extend vertically and present at least one intermediate elongated cavity having an air inlet opening arranged in a lower region thereof and an air outlet opening arranged in an upper region thereof, wherein air is forced to flow through said cavity by means of self-circulation and the support structure is manufactured from a heat-conductive material and provided with cooling flanges, the support structure supporting electronic circuits and electronic components, and said circuits and components are positioned so that heat generated in said components is transported to the flat sections of the support structure and said cooling flanges.

2. Device according to claim 1, wherein said electronics unit is at least partly enclosed by a radome which together with the support structure and the antenna unit form said cavity and present said inlet opening and outlet opening.

3. Device according to claim 1, wherein the support structure presents wall sections which, together with the antenna unit, form a further cavity which is connected to said inlet and outlet openings in the lower and upper regions, respectively.

4. Device according to claim 3, characterized in that said cooling flanges project into said cavity.

* * * * *